(12) United States Patent
Li et al.

(10) Patent No.: US 9,977,102 B2
(45) Date of Patent: May 22, 2018

(54) LOCAL COIL RECEIVING CHANNEL SELECTOR FOR MAGNETIC RESONANCE IMAGING SYSTEM

(71) Applicants: Wen Ming Li, Shenzhen (CN); Zhi Guo Sun, Shenzhen (CN); Tong Tong, Shenzhen (CN)

(72) Inventors: Wen Ming Li, Shenzhen (CN); Zhi Guo Sun, Shenzhen (CN); Tong Tong, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 902 days.

(21) Appl. No.: 14/493,561

(22) Filed: Sep. 23, 2014

(65) Prior Publication Data

US 2015/0112184 A1 Apr. 23, 2015

(30) Foreign Application Priority Data

Sep. 24, 2013 (CN) ..................... 2013 2 0590564 U

(51) Int. Cl.
*G01V 3/00* (2006.01)
*G01R 33/36* (2006.01)
*G01R 33/3415* (2006.01)

(52) U.S. Cl.
CPC ...... *G01R 33/3664* (2013.01); *G01R 33/3415* (2013.01)

(58) Field of Classification Search
USPC ........................................ 324/307
See application file for complete search history.

(56) References Cited

U.S. PATENT DOCUMENTS

| 5,666,055 A * | 9/1997 | Jones ................. | G01R 33/3415 324/318 |
| 6,438,402 B1 * | 8/2002 | Hashoian .............. | G01R 33/34 324/318 |
| 2008/0106264 A1 * | 5/2008 | Fischer ................. | A61B 5/055 324/322 |
| 2013/0193968 A1 * | 8/2013 | Biber .................. | G01R 33/341 324/309 |
| 2014/0176137 A1 * | 6/2014 | Chen .................. | G01R 33/3664 324/322 |

* cited by examiner

*Primary Examiner* — Rodney Fuller
(74) *Attorney, Agent, or Firm* — Lempia Summerfield Katz LLC

(57) ABSTRACT

A local coil of an MRI system includes at least one cascade output slot, at least one cascade input slot, and at least one RF switch. The at least one RF switch includes a first input signal interface, a second input signal interface, and at least one output signal interface. The first input signal interface is connected to the at least one cascade input slot, the second input signal interface is connected to an RF signal interface of the local coil, and the output signal interface is connected to the at least one cascade output slot. The at least one RF switch is configured to output signals received by the first input signal interface and the second input signal interface from the output signal interface separately.

20 Claims, 2 Drawing Sheets

LOCAL COIL RECEIVING CHANNEL SELECTOR FOR MAGNETIC RESONANCE IMAGING SYSTEM

CROSS-REFERENCE TO RELATED APPLICATIONS

This application claims the benefit of CN 201320590564.6, filed on Sep. 24, 2013, which is hereby incorporated by reference in its entirety.

TECHNICAL FIELD

The present embodiments relate to the technical field of magnetic resonance imaging (MRI), and, in particular, to a local coil receiving channel selector for an MRI system.

BACKGROUND

Magnetic resonance imaging (MRI) is an imaging technology involving biomagnetism and nuclear spin that has grown rapidly with the development of computer technology, electronic circuit technology, and superconductor technology. MRI uses a magnetic field and radio frequency (RF) pulses to cause nutation of processing hydrogen nuclei (e.g., H+) in human tissue to generate RF signals, which are processed by computer to form an image. When an object is placed in the magnetic field, if the object is irradiated with appropriate electromagnetic waves to make the object resonate, and the electromagnetic waves released thereby are analyzed, it is possible to discover the positions and types of the atomic nuclei that form the object. On this basis, a precise three-dimensional image of the interior of the object may be drawn. For example, MRI may be used to scan a human brain to obtain a moving image of contiguous slices, beginning at the top of the head and going all the way to the base thereof.

Compared with other medical imaging products such as X-ray and computed tomography (CT) products, a MRI system may provide high-contrast images of different soft tissues. Full-body imaging matrix is an effective technology for performing a full-body scan with a MRI system. The MRI system offers the largest coverage, the highest signal-to-noise ratio, and the fastest speed. Multi-channel local coil technology is also an important constituent part of full-body imaging matrix technology. In the course of scanning, a user will often connect to the system multiple local coils that may be used simultaneously, and select some of the units of each local coil when examining a specific part of the body. During this process, the user does not need to change local coils or reposition the patient during scanning. Therefore, full-body imaging matrix technology is able to freely switch the signals received by the local coil unit of interest to the receiver.

In certain MRI systems, there are numerous types of local coil arrangements, with local coils of different types having different mechanical structures or different numbers of receiving channels. Furthermore, flexible local coils are the most commonly used and convenient type of local coil, and may be used to image various parts of the body such as the shoulder joint, the abdomen and the knee joint, owing to their property of being flexible and bendable. Moreover, since flexible local coils are lightweight and inexpensive, many clinical applications opt to substitute two or more flexible local coils for dedicated local coils used to image specific parts of the body, such as head/neck coils and limb coils.

One way of making a MRI system compatible with multiple local coils has been to increase the number of system slots and the number of receiving channels. A shortcoming of this method is that it increases the cost of the patient table and the receiving assembly, while making research, development, and design more complicated. Secondly, since the number of system slots in a MRI system is limited, the number of local coils that may be connected simultaneously to a single MRI system is also limited. Moreover, each local coil has a long cable carrying a plug; laying out and using multiple local coils together with the cables thereof is not only very troublesome for the operator, it also has a significant effect on the comfort of the patient.

SUMMARY

The scope of the present invention is defined solely by the appended claims and is not affected to any degree by the statements within this summary. The present embodiments may obviate one or more of the drawbacks or limitations in the related art.

The embodiments include a method capable of cascading multiple local coils of the same structure (e.g., flexible coils and non-flexible coils). The method includes one RF switch to be added inside a flexible coil, this RF switch enabling RF output signals from each of the various cascaded local coils to be outputted in turn to the MRI system, with multiple connectors and a cable carrying a plug also being added outside the local coils. Multiple local coils may be joined together by the cable and connectors, thereby saving space and facilitating clinical procedures.

Presented in an embodiment is a local coil of a MRI system, including at least one cascade output slot, at least one cascade input slot, and at least one RF switch, wherein the RF switch includes a first input signal interface and a second input signal interface and at least one output signal interface, wherein the first input signal interface is connected to the cascade input slot, the second input signal interface is connected to a RF signal interface of the local coil, the output signal interface is connected to the cascade output slot, and the RF switch is used for outputting signals received by the first input signal interface and the second input signal interface from the output signal interface separately.

The cascade output slot and the cascade input slot are located on two sides, respectively, of the local coil.

The local coil further includes at least one connector, for connecting the cascade input slot and the cascade output slot of two of the local coils.

The local coil further includes at least one cable, for having one end connected to the cascade output slot, and another end connected to the system slot.

Also presented in an embodiment is a MRI system, including a local coil according to any one of the above.

DETAILED DESCRIPTION

It should be understood that the particular embodiments described here are intended merely to illustrate the present utility model, not to define the scope of protection thereof.

Figure 1:
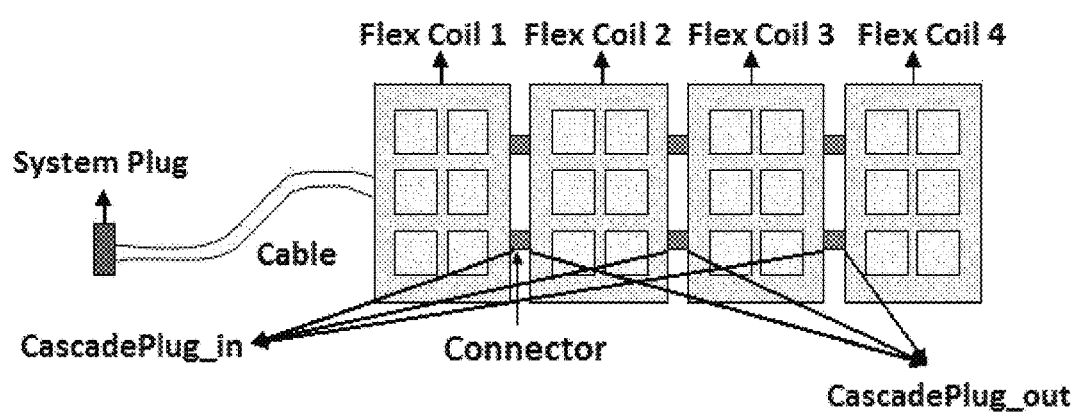
FIG. 1 is a schematic diagram depicting how local coils are cascaded according to a particular embodiment.

In certain embodiments, a cascade design for local coils is presented, to reduce the complexity and limitations introduced when multiple local coils with cables are used simultaneously. FIG. 1 is a schematic diagram depicting how local coils are cascaded according to a particular embodiment. As FIG. 1 depicts, each local coil (e.g., Flex Coil 1, Flex Coil 2, Flex Coil 3, and Flex Coil 4) includes at least one cascade input slot CascadePlug_in and at least one cascade output slot CascadePlug_out. The cascade input slots CascadePlug_in are located on one side of each local coil while the cascade output slots CascadePlug_out are located on the other side of each local coil, to facilitate wiring in a cascade. Each cascade input slot CascadePlug_in is used for connecting to a cascade output slot CascadePlug_out of another local coil, or is unloaded. Each cascade output slot CascadePlug_out is used for connecting to a cascade input slot CascadePlug_in of another local coil or connecting to a system slot SystemPlug of the MRI system. The interior of each local coil further includes at least one RF switch circuit. The RF switch is used for controlling the output of RF signals from the various cascaded local coils in turn to the MRI system. The RF switch includes a first input signal interface and a second input signal interface and at least one output signal interface, wherein the first input signal interface is connected to the cascade input slot, the second input signal interface is connected to a RF signal interface of the local coil, and the output signal interface and the cascade output slot are connected between the cascade slot and cable slot.

Each local coil (e.g., Flex Coil 1, Flex Coil 2, Flex Coil 3 and Flex Coil 4) includes a Cable, with the cascade output slot CascadePlug_out being connected to the system slot SystemPlug of the MRI system via the Cable. In other words, the Cable has one end connected to the cascade output slot CascadePlug_out and another end connected to the system slot SystemPlug. Each local coil (e.g., Flex Coil 1, Flex Coil 2, Flex Coil 3 and Flex Coil 4) also includes one or more connectors for connecting between a cascade input slot CascadePlug_in and a cascade output slot CascadePlug_out of two local coils. In other words, the connector has one end connected to a cascade input slot CascadePlug_in, and another end connected to a cascade output slot CascadePlug_out, thereby cascading two local coils.

The local coil may include the following advantages. First, multiple local coils may be used in a cascade, thereby reducing multiple cables to one cable, saving space and facilitating layout, and increasing patient comfort. Second, multiple local coils occupy just one system slot, allowing the system to have more slots available for use by other local coils. Third, in the case where the local coils are of a single type, the local coils may be combined flexibly according to the size of the scanning range, reducing operational complexity for the operator, Fourth, users may select different numbers of local coils according to their needs, and dispense with several specific coils (e.g. body coil, knee joint coil, shoulder joint coil, etc.), thereby reducing outlay. Fifth, the fact that multiple local coils are cascaded provides that the local coils may replace each other. For example, if one of the local coils develops a fault, the local coil may be replaced by another local coil, with no impact on customer use, avoiding wastage of customer time due to local coil faults.

Each of the cascaded local coils according to a particular embodiment includes a RF switch for switching RF channels, to output multiple RF signals in turn to an input port (e.g., system slot) of the MRI system. The RF switch may be realized in many ways, for example as a programmable logic device; in the local coil according to a particular embodiment, the RF switch uses a tuning/detuning control line of the system itself to switch RF channels.

Figure 2:
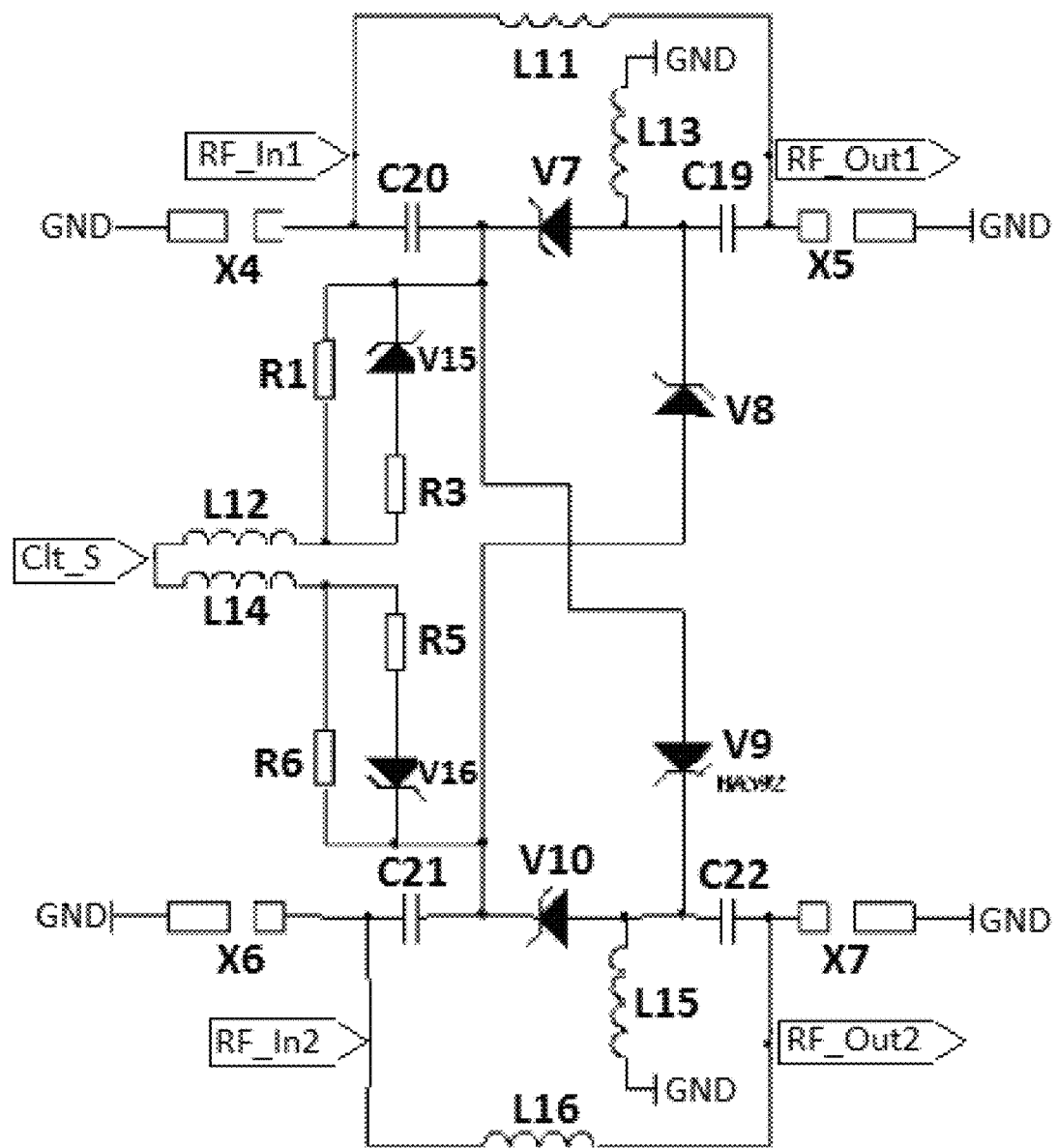
FIG. 2 depicts a circuit diagram of a RF switch of a local coil according to a particular embodiment.

FIG. 2 is a circuit diagram of a RF switch of a local coil according to an embodiment. As FIG. 2 depicts, the RF switch includes a first diode V15, a second diode V16, a third diode V7, a fourth diode V10, a fifth diode V8 and a sixth diode V9. The anodes of the first diode V15 and the sixth diode V16 are connected to a control signal interface Clt_S, the cathode of the first diode V15, and the cathode of the third diode V7. The first input signal interface RF_in1 and the anode of the sixth diode V9 are connected. The cathode of the second diode V16 and the cathode of the fourth diode V10 and the second input signal interface RF_in2 and the anode of the fifth diode V8 are connected. The anode of the third diode V7 and the cathode of the fifth diode V8 are connected to the first output signal interface RF_out1. The anode of the fourth diode and the cathode of the sixth diode are connected to the second output signal interface RF_out2.

As FIG. 2 depicts, the RF switch includes two output signal interfaces and two input signal interfaces, e.g., the first output signal interface RF_out1, the second output signal interface RF_out2, the first input signal interface RF_in1 and the second input signal interface RF_in2. With regard to the RF switch, if the tuning/detuning control signal (Clt_S) is in a 100 mA state, diodes V16, V8, V15, and V9 conduct whereas diodes V7 and V10 are switched off. A MR signal may be transmitted via the first input signal interface RF_in1 to the second output signal interface RF_out2 to be outputted, while a signal from the second input signal interface RF_in2 is outputted via the first output signal interface RF_out1. When the tuning/detuning control signal (Clt_S) is in a −30 V state, diodes V7 and V10 conduct whereas diodes V16, V8, V15 and V9 are switched off. A MR signal may be transmitted via the first input signal interface RF_in1 to the first output signal interface RF_out1 to be outputted, while a signal from the second input signal interface RF_in2 is outputted via the second output signal interface RF_out2.

In a case where two local coils (e.g., a first-stage local coil and a last-stage local coil) are cascaded, RF switches having two input signal interfaces and two output signal interfaces of the local coils may be provided, wherein one input signal interface of the first-stage local coil is connected to a RF signal interface of the first-stage local coil, while the other input signal interface of the first-stage local coil is unloaded. One output signal interface of the first-stage local coil is connected via a cascade slot to one input signal interface of the last-stage local coil, while the other input signal interface of the last-stage local coil is connected to a RF signal interface of the last-stage local coil. One output signal interface of the last-stage local coil is connected via a cable slot to a system signal interface of the MRI system, while the other output signal interface of the last-stage local coil is unloaded via a cascade slot.

In a case where more than two local coils (e.g., a first-stage local coil, a last-stage local coil, and at least one middle-stage local coil) are cascaded, RF switches having two input signal interfaces and two output signal interfaces of the local coils may be combined in a cascade, in order to expand the RF switches to form a RF switch having multiple input signal interfaces and two output signal interfaces, so the RF switches may be used in situations where multiple local coils are cascaded.

In the RF switch having multiple input signal interfaces and multiple output signal interfaces, one input signal interface of the first-stage local coil is connected to a RF signal interface of the first-stage local coil, while the other input signal interface of the first-stage local coil is unloaded via a cascade slot. One output signal interface of the first-stage local coil is unloaded via a cable slot, while another output signal interface of the first-stage local coil is connected via a cascade slot to an input signal interface of an adjacent middle-stage local coil.

Furthermore, in the RF switch having multiple input signal interfaces and multiple output signal interfaces, one input signal interface of the last-stage local coil is connected to a RF signal interface of the last-stage local coil, while another input signal interface of the last-stage local coil is connected via a cascade slot to an output signal interface of an adjacent middle-stage local coil. One output signal interface of the last-stage local coil is connected via a cable slot to a system signal interface of the MRI system, while another output signal interface of the last-stage local coil is unloaded via a cascade slot.

Additionally, in the RF switch having multiple input signal interfaces and multiple output signal interfaces, one input signal interface of a middle-stage local coil is connected to a RF signal interface of said middle-stage local coil, while another input signal interface of the local coil of this stage is connected via a cascade slot to an output signal interface of the local coil of the stage thereabove. One output signal interface of a middle-stage local coil is unloaded via a cable slot, while another output signal interface of the middle-stage local coil is connected via a cascade slot to an input signal interface of the local coil of the stage therebelow.

Moreover, in the case where more than two local coils (e.g., a first-stage local coil, a last-stage local coil, and at least one middle-stage local coil) according to a particular embodiment are cascaded, RF switches having two input signal interfaces and two output signal interfaces of the local coils according to a particular embodiment may be combined in parallel, in order to expand the RF switches to form a RF switch having multiple input signal interfaces and multiple output signal interfaces, so the RF switches may be used in situations where multiple local coils are cascaded. Details of use of these RF switches are described above with reference to the discussion of RF switches combined in cascade.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil of a magnetic resonance imaging system, comprising:
    at least one cascade output slot;
    at least one cascade input slot; and
    at least one RF switch comprising a first input signal interface, a second input signal interface, and at least one output signal interface, wherein the first input signal interface is connected to the cascade input slot, the second input signal interface is connected to a RF signal interface of the local coil, and the output signal interface is connected to the cascade output slot, and
    wherein the RF switch is configured to output signals received by the first input signal interface and the second input signal interface from the output signal interface separately.

2. The local coil as claimed in claim 1, wherein the cascade output slot and the cascade input slot are located on two sides, respectively, of the local coil.

3. The local coil as claimed in claim 2, further comprising at least one connector, the at least one connector configured to connect the cascade input slot and the cascade output slot of two of the local coils.

4. The local coil as claimed in claim 3, further comprising at least one cable having a first and a second end, wherein the first end of the at least one cable is connected to the cascade output slot, and the second end of the at least one cable is connected to a system slot.

5. The local coil as claimed in claim 2, further comprising at least one cable having a first and a second end, wherein the first end of the at least one cable is connected to the cascade output slot, and the second end of the at least one cable is connected to a system slot.

6. The local coil as claimed in claim 1, further comprising at least one connector, the at least one connector configured to connect the cascade input slot and the cascade output slot of two of the local coils.

7. The local coil as claimed in claim 1, further comprising at least one cable having a first and a second end, wherein the first end of the at least one cable is connected to the cascade output slot, and the second end of the at least one cable is connected to a system slot.

8. The local coil as claimed in claim 1, wherein the at least one RF switch is configured to switch RF channels using a tuning and detuning control link.

9. A magnetic resonance imaging (MRI) system comprising:
    a plurality of local coils, wherein each local coil of the plurality of local coils comprises:
        at least one cascade output slot;
        at least one cascade input slot; and
        at least one RF switch comprising a first input signal interface, a second input signal interface, and at least one output signal interface, wherein the first input signal interface is connected to the cascade input slot, the second input signal interface is connected to a RF signal interface of the local coil, and the output signal interface is connected to the cascade output slot, and
        wherein the RF switch is configured to output signals received by the first input signal interface and the second input signal interface from the output signal interface separately.

10. The magnetic resonance imaging system as claimed in claim 9, wherein the plurality of local coils occupies a single system slot.

11. The magnetic resonance imaging system as claimed in claim 9, wherein the plurality of local coils is arranged in cascade.

12. The magnetic resonance imaging system as claimed in claim 9, wherein each local coil of the plurality of local coils is a same type of local coil.

13. The magnetic resonance imaging system as claimed in claim 9, wherein the plurality of local coils comprises a first-stage local coil and a last-stage local coil arranged in cascade,
- wherein a first input signal interface of the first-stage local coil is connected to a RF signal interface of the first-stage local coil, and a second input signal interface of the first-stage local coil is unloaded,
- wherein a first output signal interface of the first-stage local coil is connected via a cascade slot to a first input signal interface of the last-stage local coil, and a second input signal interface of the last-stage local coil is connected to a RF signal interface of the last-stage local coil, and
- wherein a first output signal interface of the last-stage local coil is connected via a cable slot to a system signal interface of the MRI system, and a second output signal interface of the last-stage local coil is unloaded via a cascade slot.

14. The magnetic resonance imaging system as claimed in claim 9, wherein the plurality of local coils comprises a first-stage local coil, at least one middle-stage local coil, and a last-stage local coil arranged in cascade.

15. The magnetic resonance imaging system as claimed in claim 14, wherein a first input signal interface of the first-stage local coil is connected to a RF signal interface of the first-stage local coil, and a second input signal interface of the first-stage local coil is unloaded via a cascade slot, and
- wherein a first output signal interface of the first-stage local coil is unloaded via a cable slot, and a second output signal interface of the first-stage local coil is connected via a cascade slot to an input signal interface of an adjacent middle-stage local coil.

16. The magnetic resonance imaging system as claimed in claim 15, wherein a first input signal interface of the last-stage local coil is connected to a RF signal interface of the last-stage local coil, and a second input signal interface of the last-stage local coil is connected via a cascade slot to an output signal interface of an adjacent middle-stage local coil, and
- wherein a first output signal interface of the last-stage local coil is connected via a cable slot to a system signal interface of the MRI system, and a second output signal interface of the last-stage local coil is unloaded via a cascade slot.

17. The magnetic resonance imaging system as claimed in claim 16, wherein a first input signal interface of the at least one middle-stage local coil is connected to a RF signal interface of the at least one middle-stage local coil, and a second input signal interface of the at least one middle-stage local coil is connected via a cascade slot to an output signal interface of the local coil of an adjacent stage above, and
- wherein a first output signal interface of the at least one middle-stage local coil is unloaded via a cable slot, and a second output signal interface of the at least one middle-stage local coil is connected via a cascade slot to an input signal interface of the local coil of an adjacent stage below.

18. The magnetic resonance imaging system as claimed in claim 17, wherein the plurality of local coils occupies a single system slot.

19. The magnetic resonance imaging system as claimed in claim 17, wherein each local coil of the plurality of local coils is a same type of local coil.

20. The magnetic resonance imaging system as claimed in claim 9, wherein the plurality of local coils comprises a first-stage local coil, at least one middle-stage local coil, and a last-stage local coil arranged in cascade,
- wherein RF switches comprising two input signal interfaces and two output signal interfaces of the plurality of local coils are combined in parallel.

* * * * *